(12) United States Patent
Kosic et al.

(10) Patent No.: US 8,773,294 B2
(45) Date of Patent: Jul. 8, 2014

(54) BACKGROUND TECHNIQUES FOR COMPARATOR CALIBRATION

(75) Inventors: Stephen R. Kosic, San Diego, CA (US); Jeffrey P. Bray, San Diego, CA (US)

(73) Assignee: Analog Devices, Inc., Norwood, MA (US)

( * ) Notice: Subject to any disclaimer, the term of this patent is extended or adjusted under 35 U.S.C. 154(b) by 100 days.

(21) Appl. No.: 13/490,673

(22) Filed: Jun. 7, 2012

(65) Prior Publication Data
US 2013/0328609 A1   Dec. 12, 2013

(51) Int. Cl.
*H03M 1/10* (2006.01)

(52) U.S. Cl.
USPC ........... 341/120; 341/118; 341/155; 341/161; 341/162

(58) Field of Classification Search
USPC .......................... 341/118, 120, 155, 161, 162
See application file for complete search history.

(56) References Cited

U.S. PATENT DOCUMENTS

| | | | |
|---|---|---|---|
| 5,394,148 A * | 2/1995 | Matsuura et al. | 341/162 |
| 5,771,012 A * | 6/1998 | Shu et al. | 341/118 |
| 6,124,818 A * | 9/2000 | Thomas et al. | 341/155 |
| 6,195,032 B1 * | 2/2001 | Watson et al. | 341/162 |
| 6,366,230 B1 * | 4/2002 | Zhang et al. | 341/162 |
| 6,570,523 B1 * | 5/2003 | Bacrania et al. | 341/155 |
| 6,714,886 B2 * | 3/2004 | Sung et al. | 702/107 |
| 6,778,110 B2 * | 8/2004 | Jansson | 341/120 |
| 7,164,379 B1 * | 1/2007 | Rao | 341/161 |
| 7,187,310 B2 * | 3/2007 | El-Sankary et al. | 341/120 |
| 2004/0075599 A1 * | 4/2004 | Jonsson et al. | 341/120 |
| 2006/0290554 A1 | 12/2006 | Ishii | |
| 2007/0096972 A1 * | 5/2007 | Kobayashi et al. | 341/155 |
| 2009/0243907 A1 * | 10/2009 | Nazemi et al. | 341/161 |
| 2010/0097252 A1 * | 4/2010 | Hsien et al. | 341/118 |
| 2012/0062400 A1 * | 3/2012 | Jeon | 341/118 |
| 2013/0135127 A1 * | 5/2013 | Siragusa | 341/110 |

FOREIGN PATENT DOCUMENTS

| | | |
|---|---|---|
| JP | 2006197196 A | 7/2006 |
| JP | 2006270726 A | 10/2006 |
| JP | 2007295378 A | 11/2007 |
| JP | 2007312195 A | 11/2007 |
| JP | 2010219749 A | 9/2010 |
| WO | 91/05409 | 4/1991 |

OTHER PUBLICATIONS

Office Action issued in the corresponding Japanese Patent Application No. 2013-117598, dated Oct. 22, 2013, 7 pages (with English translation).

* cited by examiner

*Primary Examiner* — Linh Nguyen
(74) *Attorney, Agent, or Firm* — Kenyon & Kenyon, LLP

(57) ABSTRACT

A method and a corresponding device for performing a background calibration of a comparator in a circuit having a plurality of stages that are connected in a pipelined fashion to an input signal. A digital value of a residue signal, which is output from a first stage in the plurality of stages to a subsequent stage in the plurality of stages, is calculated. The value of the residue signal is compared to at least one threshold. Based on the comparison, a triggering threshold of a selected comparator in the first stage may be adjusted.

20 Claims, 6 Drawing Sheets

BACKGROUND TECHNIQUES FOR COMPARATOR CALIBRATION

BACKGROUND INFORMATION

Electronic components are subject to operating characteristic variations. Although devices may be manufactured according to specification, no manufacturing technique can guarantee uniformity across all devices. In metal oxide semiconductor (MOS) devices, this variation is often manifested as a shifting of a threshold voltage level. For example, in a comparator circuit, mismatches in the differential pair and mismatches in the current sources may result in a comparator offset, which is a voltage offset that limits the accuracy of the comparator by affecting the performance of a comparison between an input voltage and a reference voltage. Comparator offsets occur not only as a result of random device mismatches, but are also a function of device size. One known method of reducing offsets is to increase device size. However, this requires increased power to maintain gain-bandwidth and regeneration time. For small, low-power comparators, increasing device size may not be a practical option, so that an offset compensation or cancellation scheme is required.

Comparator offsets may be categorized into two types. A first type, known as DC offset (also referred to herein as a "static" offset) is a more or less constant offset that exists when the comparator circuit is operational. A second type, referred to herein as a "dynamic" offset, occurs when the comparator circuit is switched to output a comparator decision based on the values of the inputs to the circuit. Dynamic offsets may be caused by imbalances in the circuit, such as parasitic capacitances that affect circuit components. Therefore, the causes of dynamic offsets may be unrelated to the causes of static offsets.

Techniques exist to compensate for static offsets. However, dynamic offsets remain a problem.

SUMMARY

Example embodiments of the present invention relate to methods and corresponding devices for calibrating comparators in a pipelined analog-to-digital convertor (ADC).

According to an example embodiment, a first resistor ladder and a second resistor ladder are connected to respective inputs of differential comparators in at least one stage of the ADC pipeline. Each comparator may be provided with its own first and second resistor ladders, the initial tap points of which are selected to form a pair of initial complementary inputs to the comparator. During ADC operation (when the ADC is performing a conversion), a digital residue generated by the at least one stage is calculated using output from subsequent stages, after time aligning the output from the subsequent stages to take into account time differences among the stages. Each residue value is compared to at least one threshold, preferably to an upper threshold as well as a lower threshold. Based on the comparison, the initial tap voltages applied to at least one comparator in the at least one stage may be calibrated by moving to a different tap location in the first and second resistor ladders. The calibration process described above may be repeated, e.g., once per clock cycle for a specified number of cycles, while the ADC is actively performing conversions to correct for offsets in the various comparators of the ADC. Optionally, the calibration process may be repeated as long as the ADC is actively converting input.

DETAILED DESCRIPTION OF EXAMPLE EMBODIMENTS

The present invention relates to methods and devices for comparator calibration. Exemplary embodiments of the present invention are described with reference to a comparator used in a pipelined ADC. However, the present invention may be applied towards the calibration of a comparator in other types of pipelined circuits. According to the exemplary embodiments of the present invention, comparator offset errors in a switched capacitor flash ADC are compensated for by calibrating the taps of a resistor ladder in a flash portion of the ADC. The calibration occurs during a background calibration period, i.e., while the ADC is actively performing a conversion. The calibration compensates for both static and dynamic offsets.

Figure 1:
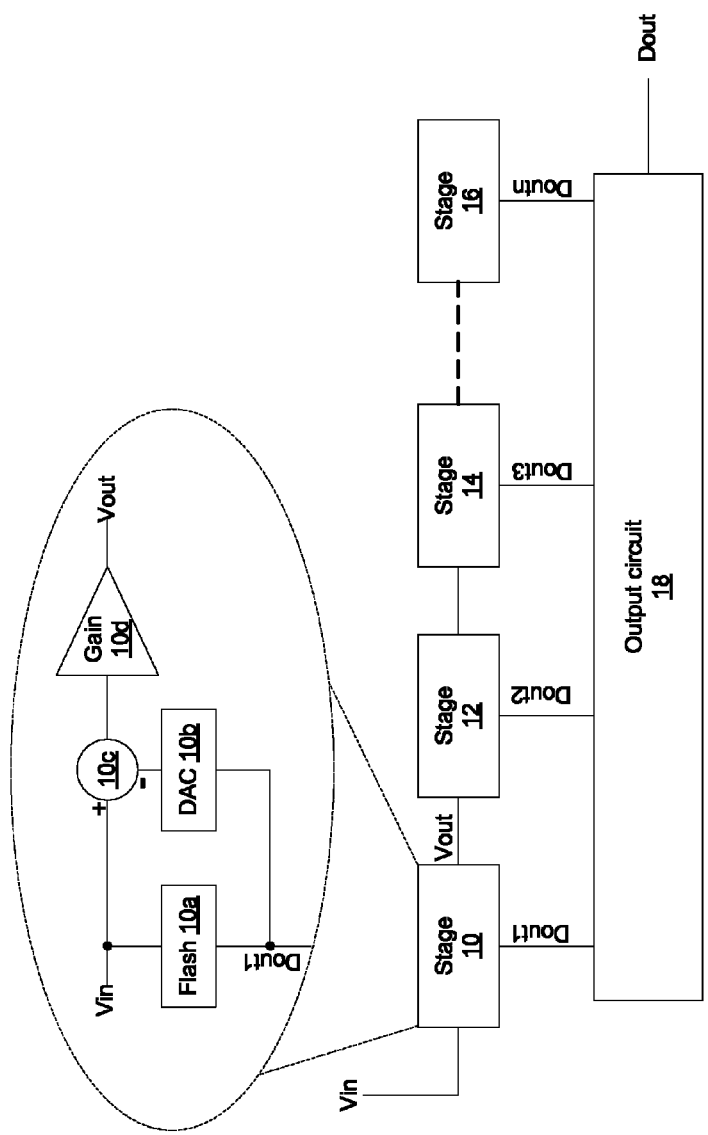
FIG. 1 is a block diagram of a conventional multi-stage pipelined analog-to-digital converter.

FIG. 1 is a block diagram of a conventional multi-stage pipelined ADC. An analog signal Vin is input to a first stage (stage 10) of the ADC. Within a flash portion of each stage, a comparison between the input and a set of reference voltages is performed by a bank of comparators, resulting in a coarse digital estimate of the input, which is output to a circuit (output circuit 18). The coarse estimate is also accurately converted to a voltage and subtracted from the input. The resulting analog residue signal is gained-up and output as the input to the next stage (e.g., stage 12). This is repeated through any number of additional stages (e.g., stages 14 to 16) until the end of the pipeline (the final stage) is reached. The number of stages can be selected based on a desired resolution of the ADC. FIG. 1 includes a blow-up view showing various components of the stage 10. Each of the remaining stages 12/14/16 may include similar components, except the final stage 16 may not include a digital-to-analog converter (DAC) or a subtraction unit. The input Vin is passed to a flash unit 10a, which performs an analog-to-digital conversion of Vin to generate a digital value Dout1. Vin may be applied to a set of comparators in the flash unit 10a. Depending on the value of Vin, any number of comparators may be triggered to generate a digital approximation of Vin, since each comparator may have a different triggering threshold. Dout1 is input to a DAC 10b, which converts Dout1 into an analog signal. The analog version of Dout1 may then be subtracted from Vin by a subtraction unit 10c, before being gained-up by a gain unit 10d and passed to the next stage (e.g., stage 12) as an analog residue signal. This process may be repeated until the end of the pipeline is reached. The overall output of the ADC is then generated by an output circuit 18, which combines the digital output of each stage (e.g., Dout1, Dout2 . . . Doutn) into a single digital output Dout. Since the stages operate in a pipelined fashion, the Doutx signals from each stage are appropriately delayed (e.g., by the output circuit 18) so that all the output signals from the same sample instant are time aligned. The output circuit 18 may then generate Dout by combining the time aligned signals, e.g., as a digital summation of the time aligned signals.

Figure 2:
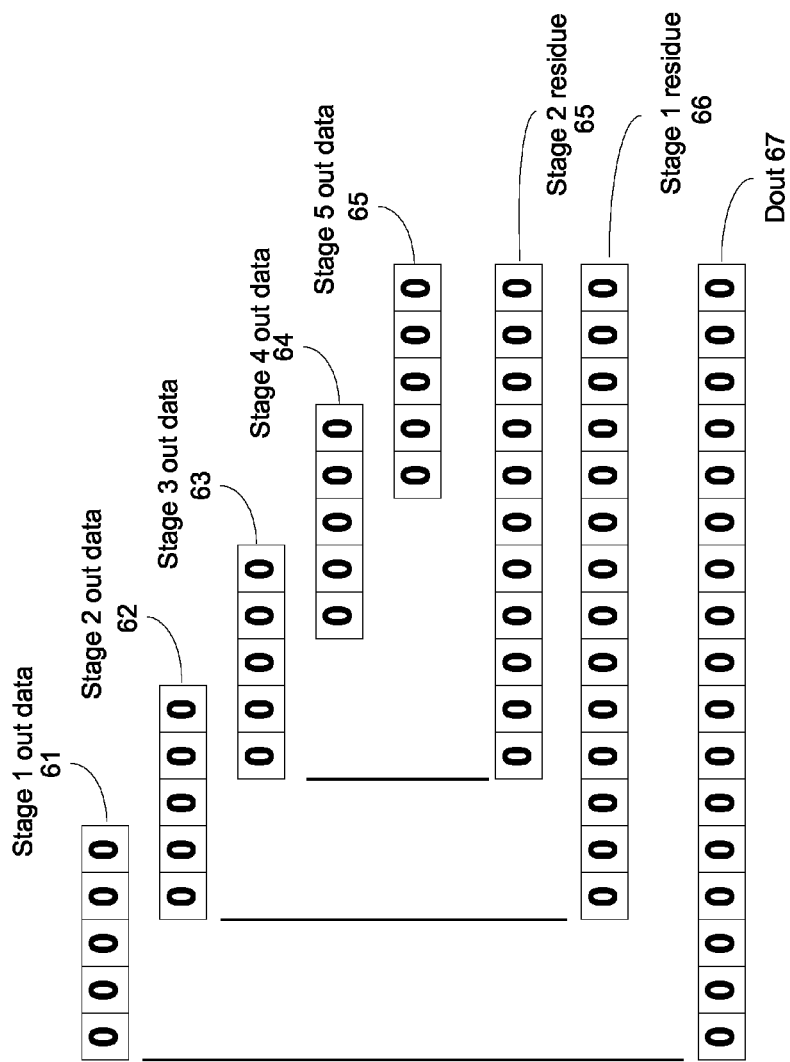
FIG. 2 is a diagram showing the calculation of an output signal for an analog-to-digital converter and the calculation of residue values for various stages in the converter.

FIG. 2 is a diagram showing how the individual Doutx signals can be combined to form the overall Dout signal. FIG. 2 also shows how the residue value can be calculated for any given stage. A four stage pipe is assumed for simplicity. However, as explained earlier, the number of stages can vary. The output data (61, 62, 63, 64 and 65) from all the stages are time aligned and combined to generate Dout 67. To calculate the residue of any given stage, the output data from all subsequent stages may be summed. For example, the residue for the second stage is the summation of the output data (63, 64 and 65), whereas the residue for the first stage is the summation of the output data (62, 63, 64 and 65).

Figure 3:
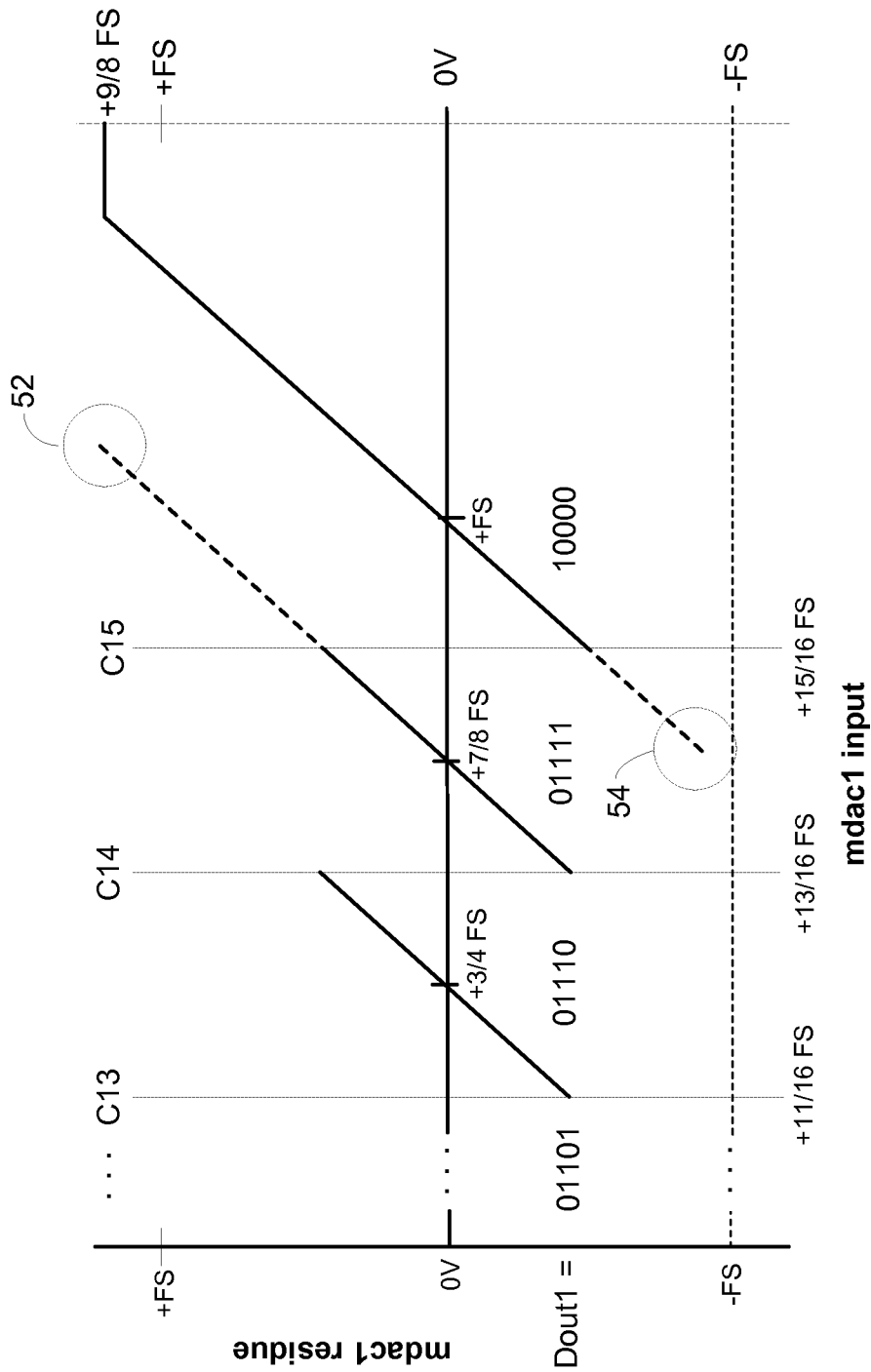
FIG. 3 is a plot showing exemplary residue values versus input for a portion of the comparators in an exemplary stage.

FIG. 3 is a plot showing exemplary residue values versus input for a portion of the comparators (e.g., comparators C13, C14 and C15) in an exemplary stage. The horizontal axis corresponds to the range of voltages at the input of the stage. The vertical axis corresponds to the analog residue generated by that stage (e.g., Vout in FIG. 1). As shown, the input may vary between a negative full scale voltage (−FS) and a positive full scale voltage (+FS) of the ADC. Triggering thresholds for each of the comparators C13/C14/C15 are represented by vertical lines that intersect the input axis. The triggering thresholds shown may correspond to ideal thresholds for each of the comparators. Comparator offsets may result in a shifting of one or more comparator thresholds to the left or right, so that the residue generated may be higher (if the shifting is to the right) or lower (if the shifting is to the left) compared to an ideal residue value (e.g., the residue may be higher than +FS/2 or lower than −FS/2).

Figure 4:
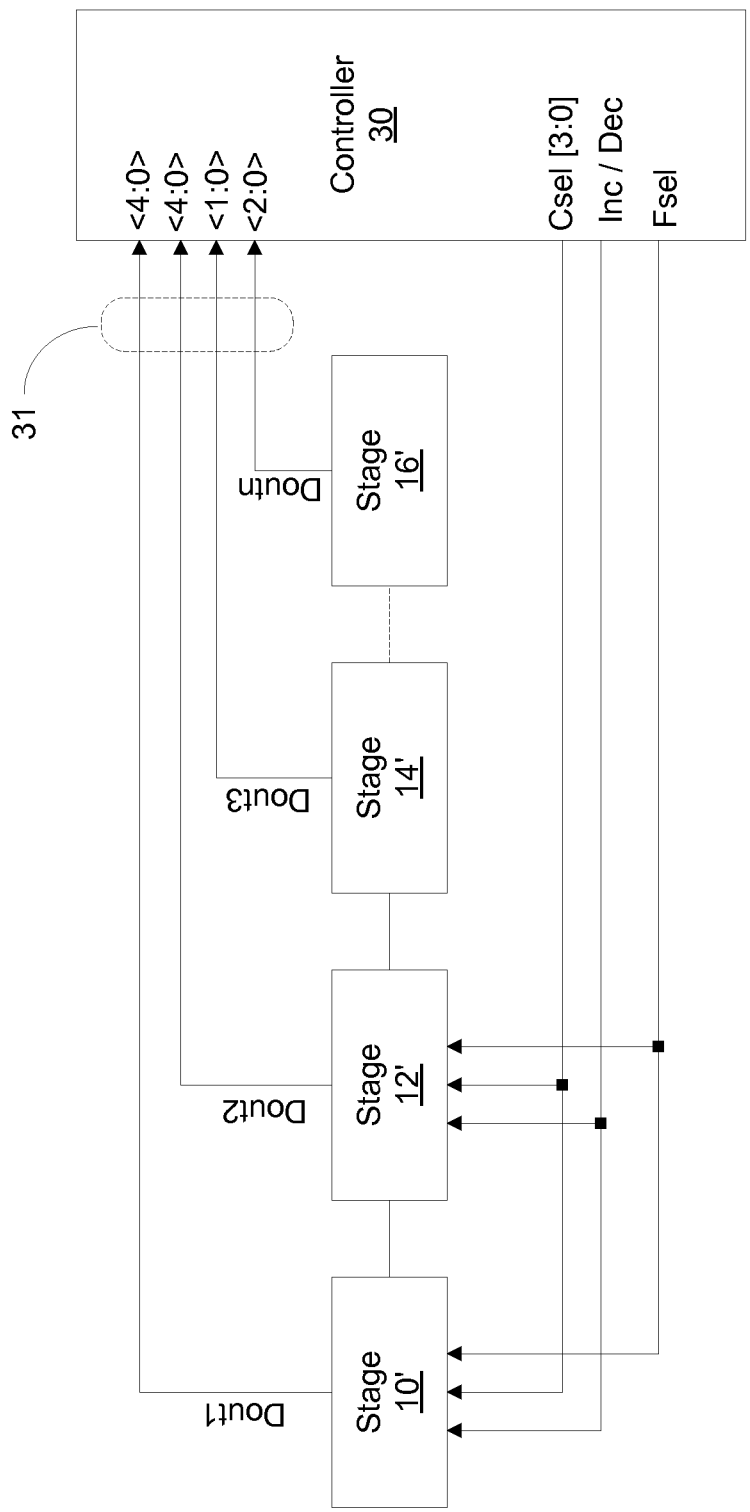
FIG. 4 is a block diagram of a system for comparator calibration according to an example embodiment of the present invention.

FIG. 4 is a block diagram of a system for comparator calibration according to an example embodiment of the present invention. The system may include a set of stages 10'/12'/14'/16' which are analogous to the stages 10/12/14/16 in FIG. 1. A controller 30 may receive the digital outputs of each stage (e.g., Dout1 in FIG. 1) via a signal bus 31. The controller may be implemented within the output circuit 18 or as a separate circuit. Since the number of comparators may vary between stages, the size of digital outputs may also vary. For illustration purposes, the digital outputs are shown as varying between two bits <1:0> and five bits <4:0>. The controller 30 may include a set of control signals Csel, Inc/Dec, and Fsel, which are output to at least one of the stages. In FIG. 4, these control signals are shown as being output to only the first two stages (stages 10' and 12') so that only the comparators of stages 10' and 12' are calibrated. However, in an alternative embodiment, the control signals may be applied to any number of stages (e.g., stages 14' and 16'). In a preferred embodiment, earlier stages (those nearest the input Vin) are calibrated before later stages. For example, at least the first stage 10' may be calibrated. The operation of the controller 30 will be described in further detail below.

Figure 5:
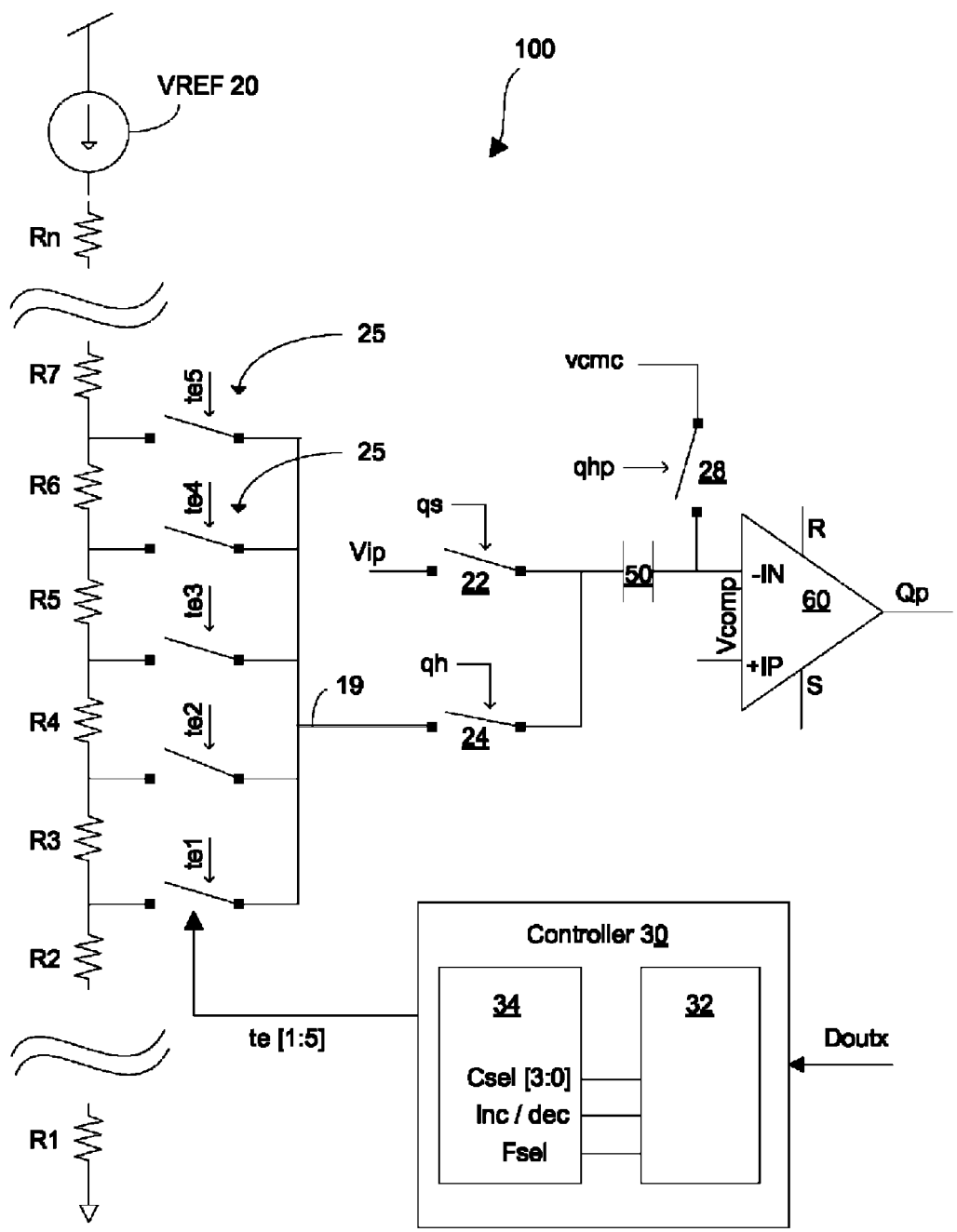
FIG. 5 is a schematic diagram of a circuit for comparator calibration according to an example embodiment of the present invention.

FIG. 5 is a schematic diagram of a circuit 100 for comparator calibration according to an example embodiment of the present invention. The circuit 100 includes a resistor ladder formed by a plurality of resistors, including resistors R1/R2/R3/R4/R5/R6/R7/Rn. The resistor ladder is connected between a reference voltage (VREF 20) and a substrate or ground voltage (e.g., Vss). In an alternative embodiment, VREF 20 can be replaced with a current source. The circuit 100 may also include a plurality of switches 22/24/25/28, a comparator 60 and a controller 30. With the exception of the controller 30, the remaining components of the circuit 100 may exist in (i.e., local to) the flash portion of each stage in the ADC of FIG. 1. The controller 30 may be centrally located, e.g., within the ADC. The circuit 100 shows only one comparator, however it will be understood that various components, such as the resistor ladder and the connections to the controller 30 can be replicated for each comparator in the stage being calibrated.

The resistors R1 to Rn may, but need not have the same resistance value and the nodes between successive resistors form tap points, with different voltages at each tap, e.g., increasing voltage up the ladder from R1 towards Rn.

The switch 24 may be activated in response to a control signal (qh) that signals the beginning of a hold phase of operation in which the bottom plate of the capacitor 50 is connected to a common node 19, to which a selected tap voltage is applied, and the top plate of the capacitor 50 is connected to a common mode voltage (vcmc).

The switches 25 may be activated in response to a digital control signal (te[1:5]), which is derived from the control signals (Csel, Inc/Dec, and Fsel) generated by the controller 30. For illustration purposes, the circuitry for deriving the control signal te[1:5] has been omitted. However, the function of each of these signals will be described such that one of ordinary skill in the art would understand how to fully implement the circuit 100. Each bit of the control signal te[1:5] may activate a respective switch 25 to connect the common node 19 to a respective tap point. Only one switch 25 may be active at a time so that a single tap point is connected to the common node 19. The switch 22 may be activated in response to a control signal (qs) that signals the beginning of the sample phase of operation. During the sample phase, the input signal Vip is applied to the bottom plate of capacitor 50, the top plate of which is connected to a first input terminal −IN of the comparator 60. Since the top plate is floating (the input to the comparator has a high impedance) the voltage at the top plate is equal to the difference between the input Vip and the selected tap voltage which was sampled onto the capacitor 50 during the hold phase. The comparator 60 will trigger when Vip is greater than the selected tap voltage. Thus, the selected tap voltage determines the triggering threshold of the comparator 60.

The switch 28 may be activated in response to a control signal (qhp) that operates to connect the top plate of the comparator to vcmc during the hold phase. The control signals qh and qhp may be the same except that qhp is de-activated a short time before qh is de-activated in order to precisely define the sampling instant, e.g., qhp may be de-activated approximately 100 pS before qh.

The comparator 60 may include a second input terminal +IP. Although not shown in the drawings, it will be understood that the circuitry analogous to that which is connected to the first input terminal −IN may also be provided for the second input terminal +IP. That is, +IP may be connected to a symmetric circuit having elements connected in opposite polarity to the components connected to −IN, so that a complementary input voltage Vin is sampled onto the second input terminal. The comparator 60 generates a digital output signal Qp. The set of Qp signals generated by the comparators 60 in a given stage (e.g, 16 Qp signals generating a 16-bit value) represents the raw digital output of the flash and is known as a thermometer code. The thermometer code may be converted into a binary code (e.g., 5-bits) that forms the digital output from the flash. This binary code corresponds to the signal Dout1 in FIG. 1 and forms the digital output transmitted to the controller 30 via the bus 31 in FIG. 4.

The controller 30 may include a logic block 32 and a selection block 34. The logic block 32 receives the binary codes (one or more Doutx signals in FIG. 4) and may calculate the digital residue value of any given stage using the binary codes. For example, to calculate the residue of stage 10', the codes for each subsequent stage (e.g., stages 12', 14' and 16') may be combined.

The controller 30 may also determine, based on the values of the calculated residues, which tap point to connect the common node 19 to (i.e., it determines which of the switches 25 is activated). The determination based on the residue value is described below in connection with exemplary embodiments of a method according to the present invention.

The control signal te[1:5] may be output in response to one or more signals from the logic block 32. In one embodiment, the selection block 34 outputs te[1:5] in response to a set of inputs that include an address signal (Csel [3:0]), an increment/decrement signal (inc/dec) and a flash selection signal (Fsel). Csel[3:0] is used to address a specific comparator 60 in a specific flash. Fsel is used to select (activate) the flash in which the addressed comparator is located. Inc/dec is used to step through the ladder taps by sequentially activating or deactivating the switches 25. Prior to background calibration, one or more stages in the ADC may be set to a respective initial tap point (e.g., using a foreground calibration technique that calibrates the comparators in the time period prior to ADC operation, or set to a nominal tap voltage). The background calibration technique of the present invention then adjusts this initial tap point by incrementing up or down the ladder. In cases where foreground calibration is also applied, the tap point is adjusted in both the foreground and background, so that the background calibration operates to fine-tune the calibration made in the foreground.

Stepping through the ladder may involve incrementing or decrementing to an adjacent tap. For example, if the initial tap point corresponds to te[3] (i.e., the switch controlled by te[3] is initially closed) and inc/dec is set to indicate incrementing, te[4] may be output. Thus, one bit in te[1:5] may be output at any given time to select a tap point. Other control sequences may also be possible for selecting the next tap point. For example, it may be possible to move to a non-adjacent tap point (e.g., incrementing in steps of two instead of one).

Figure 6:
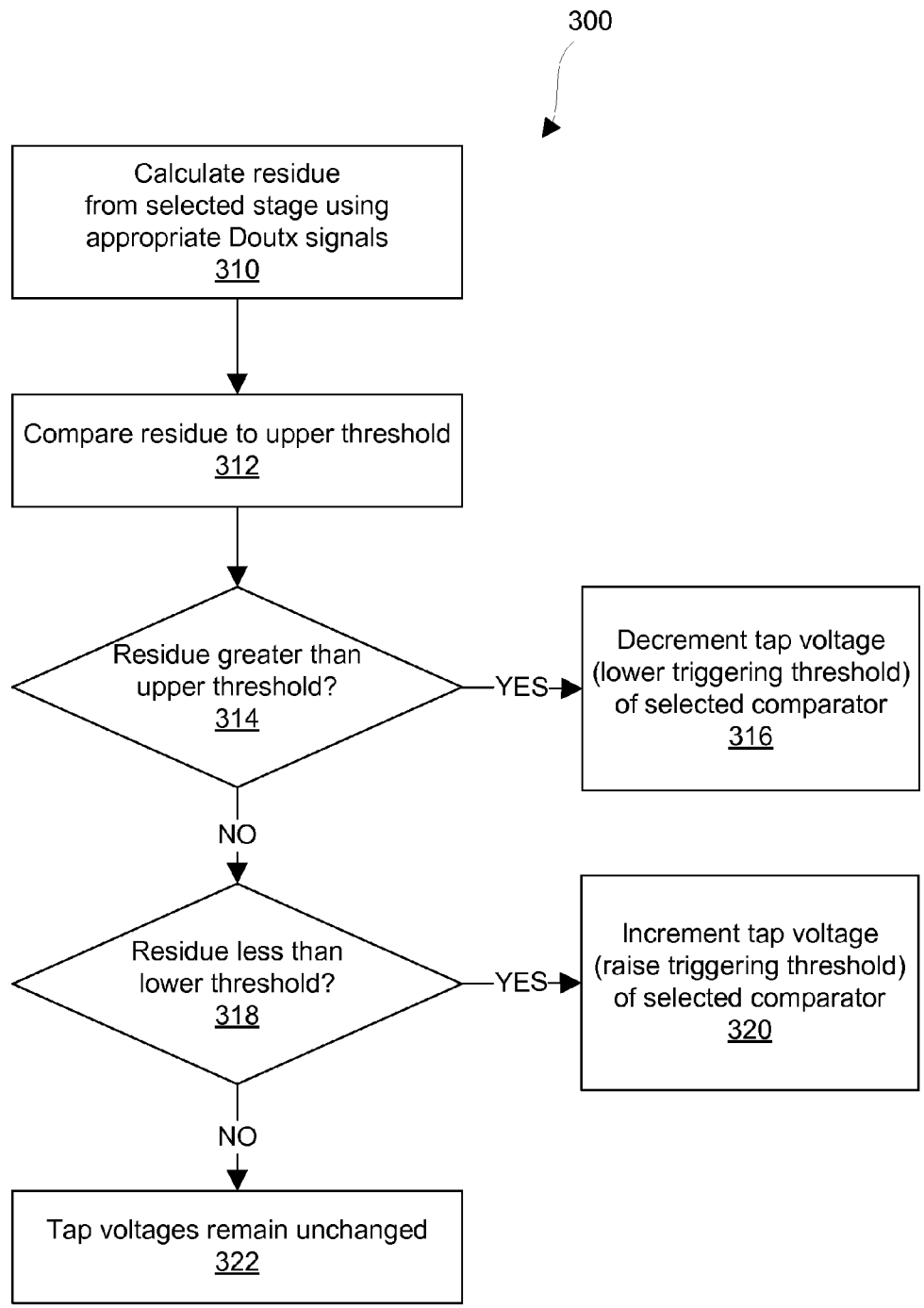
FIG. 6 is a flow chart of a method for comparator calibration according to an example embodiment of the present invention.

FIG. 6 is a flowchart of a method 300 for comparator calibration according to an example embodiment of the present invention. The method 300 may be used in conjunction with the circuit 100. Other circuit arrangements (e.g., pipelined ADCs) may also be suited for use with this method. According to an example embodiment, the method 300 may be performed on a selected portion of the ADC, in particular the coarsest stages, rather than in all the stages. For example, the method 300 may be applied to the first two or three stages.

In step 310, the residue for a given stage may be digitally calculated using appropriately delayed output signals. For example, as previously described in connection with FIG. 2, the output signals from each of the stages are time aligned (e.g., delaying output signals from earlier stages relative to later stages). After time alignment, the residue value for any given stage can be calculated as the summation of the Doutx signals from all subsequent stages.

In step 312, the residue value may be analyzed by comparing to an upper threshold. Referring back to FIG. 3, the residue is shown to ideally vary between approximately +FS/2 and −FS/2. However, when the comparator thresholds are shifted by offsets, the magnitude of the residue can be FS or greater (e.g., greater than +FS at reference numeral 52 in FIG. 3 or approximately −FS at reference numeral 54). Thus, in one embodiment, the upper threshold may be any value substantially equal to +FS. Additionally, a lower threshold may be any value substantially equal to −FS. While the upper threshold is greater than the lower threshold, the magnitude of the upper and lower thresholds need not be the same.

In step 314, the controller 30 may determine whether the residue is greater than the upper threshold. If the residue exceeds the upper threshold, then the method proceeds to step 316.

In step 316, the next tap point (voltage) is selected by decrementing, e.g., by decrementing the value of te[1:5] of a selected comparator. The selection of which comparator is calibrated is a function of the binary codes output by the bus 31. The binary code output by any given stage can be used to select a single comparator in that stage. Referring back to FIG. 3, exemplary values for the code output (Dout1) by an example stage are shown versus the mdac1 input. If all the comparators (e.g., C0 through C15) are triggered, then Dout1=10000. If the mdac1 residue is near +FS (52) then the threshold of C15 is too high, so that C15 does not trigger, and therefore Dout1 is a lower value (e.g., 01111) instead of the correct value 10000. This error can be corrected by decrementing the tap point for C15 to lower its triggering threshold. The selection of C15 in this instance may be performed by using Csel[3:0]=Dout1. In this manner, the highest threshold level comparator that is triggered in response to the same analog input that caused the residue calculated in step 310 to be generated is selected for calibration.

If the residue does not exceed the upper threshold, then the controller 30 may determine whether the residue is less than the lower threshold (step 318). If the residue is less than the lower threshold, then the next tap point of the selected comparator is selected by incrementing (step 320). For example, in FIG. 3, if the threshold of C15 is too low (near −FS 54) this can be corrected by incrementing the tap point, using Csel[3:0]=Dout1−1 to select C15. On the other hand, if the residue is at least equal to the lower threshold, then the tap point is neither incremented nor decremented, so that the tap voltage remains the same (step 322).

As mentioned above, there may exist a complementary circuit connected to −IN. Therefore, whenever the tap voltage is incremented or decremented, a corresponding change may occur in the complementary circuit. For example, the complementary circuit may be incremented or decremented by the same amount, but in the opposite direction, as the circuit connected to +IP.

In the preceding specification, the present invention has been described with reference to specific example embodiments thereof. It will, however, be evident that various modifications and changes may be made thereunto without departing from the broader spirit and scope of the present invention as set forth in the claims that follow. The embodiments described herein may be presented combined with each other in various combinations. The specification and drawings are accordingly to be regarded in an illustrative rather than restrictive sense.

What is claimed is:

1. A method for performing a background calibration of a comparator in a circuit having a plurality of stages that are connected in a pipelined fashion to an input signal, comprising:

calculating a digital value of a residue signal, which is output from a first stage in the plurality of stages to a subsequent stage in the plurality of stages;

comparing the value of the residue signal to at least one threshold;

based on the comparison, adjusting a triggering threshold of a selected comparator in the first stage; and selecting a highest threshold level comparator that was triggered in response to an input signal that caused the residue signal, as the selected comparator.

2. The method of claim 1, wherein the at least one threshold includes an upper threshold and a lower threshold, the upper threshold being greater than the lower threshold.

3. The method of claim 2, wherein the adjusting includes:
lowering the triggering threshold when the residue signal is greater than the upper threshold; and
raising the triggering threshold when the residue signal is less than the lower threshold.

4. The method of claim 2, wherein:
the circuit is an analog-to-digital converter;
the upper threshold is approximately +FS; and
the lower threshold is approximately −FS,
where FS is a full scale value of the converter.

5. The method of claim 1, wherein the digital value of the residue signal is calculated by combining outputs from all stages subsequent to the first stage.

6. The method of claim 1, wherein the adjusting includes changing a tap point in a resistor ladder connected to an input of the selected comparator.

7. The method of claim 1, wherein the method is repeatedly performed, using stages from only a portion of the plurality of stages nearest the input signal as the first stage.

8. The method of claim 1, wherein the method is performed after adjusting the triggering threshold of the selected comparator using a foreground calibration technique.

9. The method of claim 1, wherein the selected comparator has a pair of complementary inputs and the adjusting includes changing both inputs by the same amount, but in opposite directions.

10. The method of claim 1, wherein the circuit is an analog-to-digital converter, the method further comprising:
selecting the comparator based on a digital approximation of an analog input from which the residue signal output by the first stage was generated.

11. A device for performing a background calibration of a comparator in a circuit having a plurality of stages that are connected in a pipelined fashion to an input signal, comprising:
a controller configured to:
calculate a digital value of a residue signal, which is output from a first stage in the plurality of stages to a subsequent stage in the plurality of stages;
compare the value of the residue signal to at least one threshold; and
based on the comparison, adjust a triggering threshold of a selected comparator in the first stage,
wherein the selected comparator is a highest threshold level comparator that was triggered in response to an input signal that caused the residue signal.

12. The device of claim 11, wherein the at least one threshold includes an upper threshold and a lower threshold, the upper threshold being greater than the lower threshold.

13. The device of claim 12, wherein the adjusting includes:
lowering the triggering threshold when the residue signal is greater than the upper threshold; and
raising the triggering threshold when the residue signal is less than the lower threshold.

14. The device of claim 12, wherein:
the circuit is an analog-to-digital converter;
the upper threshold is approximately +FS; and
the lower threshold is approximately −FS,
where FS is a full scale value of the converter.

15. The device of claim 11, wherein the controller calculates the digital value of the residue signal by combining outputs from all stages subsequent to the first stage.

16. The device of claim 11, wherein the adjusting includes changing a tap point in a resistor ladder connected to an input of the selected comparator.

17. The device of claim 11, wherein the controller repeatedly performs the calculating, the comparing and the adjusting, using stages from only a portion of the plurality of stages nearest the input signal as the first stage.

18. The device of claim 11, wherein the controller performs the adjusting after the triggering threshold of the selected comparator is adjusted using a foreground calibration technique.

19. The device of claim 11, wherein the selected comparator has a pair of complementary inputs and the adjusting includes changing both inputs by the same amount, but in opposite directions.

20. The device of claim 11, wherein the circuit is an analog-to-digital converter, wherein the controller selects the comparator based on a digital approximation of an analog input from which the residue signal output by the first stage was generated.

* * * * *